US007348238B2

(12) United States Patent
Liu

(10) Patent No.: US 7,348,238 B2
(45) Date of Patent: Mar. 25, 2008

(54) BOTTOM ELECTRODE FOR MEMORY DEVICE AND METHOD OF FORMING THE SAME

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 11/207,764

(22) Filed: Aug. 22, 2005

(65) Prior Publication Data

US 2007/0042545 A1    Feb. 22, 2007

(51) Int. Cl.
*H01L 21/336* (2006.01)
(52) U.S. Cl. ...................... 438/257; 438/637
(58) Field of Classification Search ........... 438/257, 438/637; 257/E27.084, E31.029
See application file for complete search history.

(56) References Cited

U.S. PATENT DOCUMENTS

| 6,117,725 | A  | * | 9/2000  | Huang .................. 438/241 |
| 6,121,086 | A  | * | 9/2000  | Kuroda et al. ............. 438/256 |
| 2001/0030367 | A1 | * | 10/2001 | Noguchi et al. ............ 257/758 |
| 2004/0175921 | A1 | * | 9/2004  | Cowley et al. ............ 438/622 |
| 2004/0224497 | A1 | * | 11/2004 | Barth ..................... 438/637 |
| 2005/0151264 | A1 | * | 7/2005  | Saito et al. ................ 257/762 |
| 2005/0242377 | A1 | * | 11/2005 | Eguchi et al. ............. 257/240 |
| 2006/0006374 | A1 | * | 1/2006  | Chang ........................ 257/2 |
| 2006/0035429 | A1 | * | 2/2006  | Cho ........................ 438/238 |
| 2006/0094236 | A1 | * | 5/2006  | Elkins et al. .............. 438/652 |

* cited by examiner

*Primary Examiner*—Thao P. Le
(74) *Attorney, Agent, or Firm*—Dickstein Shapiro LLP

(57) ABSTRACT

Contacts having use in an integrated circuit and exemplary methods of forming the contacts are disclosed. The methods involve forming a conductive cap over a metal plug. The invention can mitigate keyholes in the contacts by capping and encapsulating the conductive material used to form the contact. The exemplary cap may be made of a nitride material.

13 Claims, 4 Drawing Sheets

BOTTOM ELECTRODE FOR MEMORY DEVICE AND METHOD OF FORMING THE SAME

FIELD OF THE INVENTION

The present invention relates to the field of semiconductor devices and, in particular, to the formation of contacts for memory and other integrated circuit devices.

BACKGROUND OF THE INVENTION

A well known semiconductor memory component is random access memory (RAM). RAM permits repeated read and write operations on its memory elements. Typically, RAM devices are volatile, in that stored data is lost once the power source is disconnected or removed. Examples of RAM devices include dynamic random access memory (DRAM), synchronous dynamic random access memory (SDRAM) and static random access memory (SRAM). In addition, DRAMS and SDRAMS also typically store data in capacitors, which require periodic refreshing to maintain the stored data.

Recently, resistance variable memory elements, which include programmable conductor random access memory (PCRAM) elements employing a chalcogenide material, have been investigated for suitability as semi-volatile and non-volatile random access memory devices. One such PCRAM device is disclosed in U.S. Pat. No. 6,348,365, assigned to Micron Technology Inc. and incorporated herein by reference. In typical PCRAM devices, conductive material, such as silver, is moved within the chalcogenide material to alter the cell resistance. Thus, the resistance of the chalcogenide material can be programmed to stable higher resistance and lower resistance states. The programmed lower resistance state can remain intact for a long period, typically ranging from hours to weeks, after the voltage potentials are removed.

One aspect of fabricating resistance variable memory cells, which also occurs in fabrication of other integrated circuit devices, involves contacts used for connecting the memory cells to integrated circuitry formed several layers beneath the cells. Oftentimes, because of the high aspect ratio of long vias, contacts provided therein have either sharp corners, keyholes or both, created during the contact formation. The sharp corners are created by the long, vertical sidewalls of the vias. During plug formation in vias having high aspect ratios, CVD is incapable of filling the vias completely before the plug is closed, resulting in keyhole defects in the plugs. Subsequent chemical mechanical polishing or etchback fabrication steps can expose the key and are to create a completely smooth via topography. Additionally, cell material can fall into the keyholes during deposition, leading to a non-uniform cell surface, or worse, a cracks or breaks in the cell surface, which can cause the cell to malfunction, and effectively limits the materials that can be used in the memory cell.

The sharp corners and/or keyholes may also result in inconsistent and unreliable switching of the memory device. Put another way, these problems make the cell unable to reliably switch between high and low resistance states. Such problems also reduce memory device yield and the lifetime of a memory cell is potentially cut short. Therefore, it is important in the fabrication of integrated circuit contacts, including those employing resistance variable memory cells, to create a smooth-surfaced or faceted conductive plugs on which subsequent material may be deposited.

Referring to FIG. 1, a cross sectional view of a portion of a conventional memory device 100 is shown. A dielectric layer 110 contains metal plugs 120 which connect to lower structures of the memory device 100. For purposes of clarity, only one plug 120 is shown. For a resistance variable memory, cell material 140 is formed over the dielectric 110 and plugs 120. As discussed above, however, keyholes 130 in the metal plugs 120 can prevent smooth deposition of the cell material 140 and cause interference with the operation of the memory cell 100. Keyholes 130 are very difficult to avoid when employing conventional methods of forming metal plugs 120, such as chemical vapor deposition ("CVD").

Accordingly, there is a need for conductive contacts mitigate against formation of keyhole defects. There is also a need and desire for conductive contacts for use in a resistance variable memory device that compensate for keyhole and other defects.

BRIEF SUMMARY OF THE INVENTION

Exemplary embodiments of the invention provide contacts having smooth edges for use in an integrated circuit. Exemplary methods of forming the contacts are also disclosed. The methods involve forming a conductive cap over a metal plug, which encapsulates the conductive material used to form the contact. The exemplary cap may be made of a conductive nitride material.

In accordance with one exemplary embodiment, the integrated circuit is a resistance variable memory device.

BRIEF DESCRIPTION OF THE DRAWINGS

The above-discussed and other features and advantages of the invention will be better understood from the following detailed description, which is provided in connection with the accompanying drawings, in which.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit.

The term "resistance variable memory element" is intended to include any memory element that exhibits and holds a resistance change in response to an applied voltage.

The invention is now explained with reference to the figures, which illustrate exemplary embodiments and where like reference numbers indicate like features. It should be understood that the portions shown are illustrative of one embodiment of the invention, and that the invention encompasses other memory and non-memory integrated circuit devices that can be formed using different materials and processes than those described herein.

Figure 1:
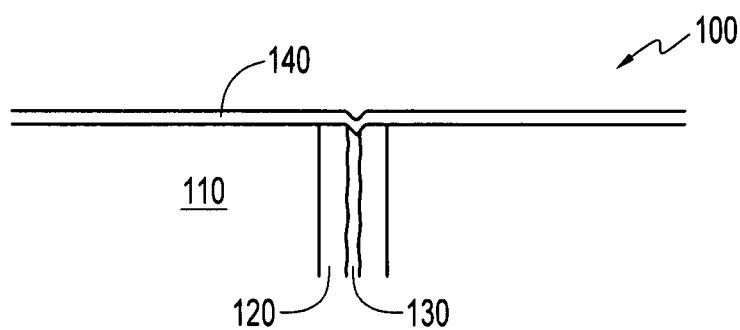
FIG. 1 is a cross-sectional view of a portion of a conventional memory device.
Figure 2:
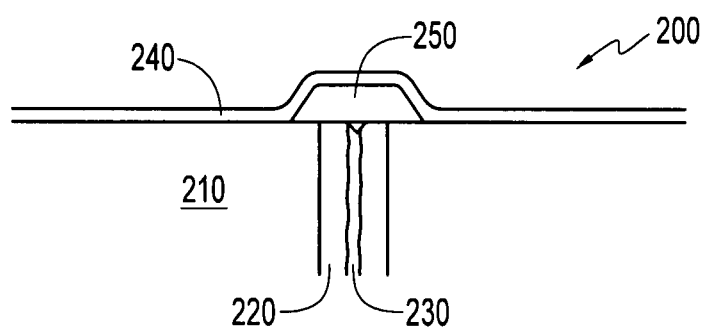
FIG. 2 is a cross-sectional view of a portion of an exemplary memory device constructed in accordance with the invention.

FIG. 2 shows a portion of an array of memory elements which includes a memory cell 200 constructed in accordance with the invention. A dielectric layer 210, formed over a substrate (not shown), contains metal plugs 220 that serve as bottom electrodes for memory device 200. For purposes of clarity, only one plug 240 is illustrated. Conductive cap 250 is formed over the metal plugs 220, covering and fitting keyholes 230 and isolating keyholes 230 from cell material 240. Resistance variable cell material 240 is formed over the dielectric 210 and cap 250. As shown in FIG. 2, the cap 250 completely cover and encapsulate keyhole defects 230, thereby preventing the irregularities in the cell material 240 that occur in the cell material 140 of prior art memory cell 100. It should be understood that cell material 240 will comprise a plurality of layers of materials used in the formation of variable resistance memory cells. Without limiting the invention, exemplary cell layers and materials are described in U.S. Pat. No. 6,849,868 to Campbell, which is incorporated herein by reference.

Referring now to FIGS. 3-8, exemplary method steps for forming the exemplary cap 250 in accordance with the invention are now described. It should be understood that the description of the materials and fabrication steps are illustrative only.

Figure 3:
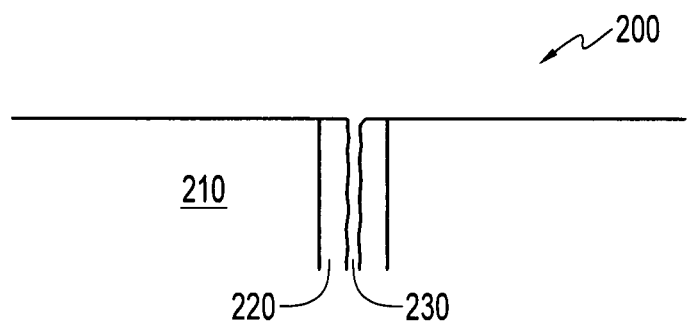
FIG. 3 is a cross-sectional view of a portion of the exemplary memory device of FIG. 2 during a stage of fabrication.

Turning to FIG. 3, metal plugs 220 are formed within dielectric layer 210 by any known process. In accordance with a preferred embodiment, the metal plugs 220 are tungsten and are formed using CVD, but other metals or conductive materials may also be used. Conventional CVD steps may leave keyhole defects 230 in the plugs 220.

Figure 4:
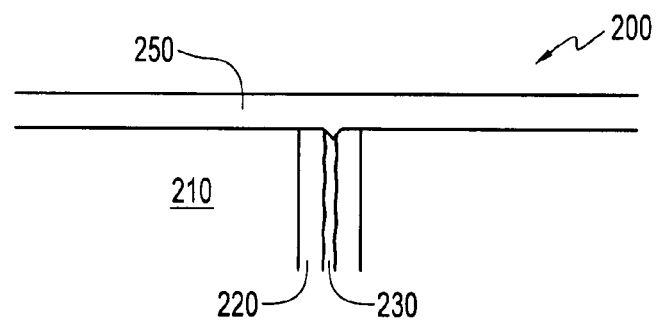
FIG. 4 is a cross-sectional view of a portion of the exemplary memory device of FIG. 2 during a stage of fabrication subsequent to that shown in FIG. 3.

Referring to FIG. 4, a conductive material layer for forming the cap 250 is blanket deposited over the dielectric 210, plugs 220 and keyholes 230. The conductive material layer is then planarized by any known process, for example, by chemical mechanical polishing (CMP). This step may also be performed by selectively depositing the material over and around the individual plugs 220. In accordance with a preferred embodiment of the invention, the conductive material is a tungsten alloy, such as, e.g., Ti/TiN/W or TiN/W, which may be deposited by physical vapor deposition (PVD) or by other known processes.

Figure 5:
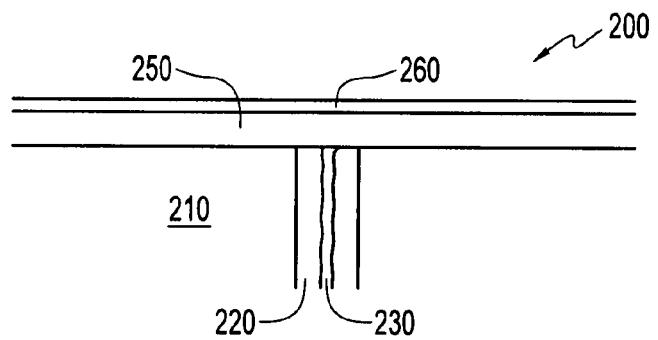
FIG. 5 is a cross-sectional view of a portion of the exemplary memory device of FIG. 2 during a stage of fabrication subsequent to that shown in FIG. 4.
Figure 6A:
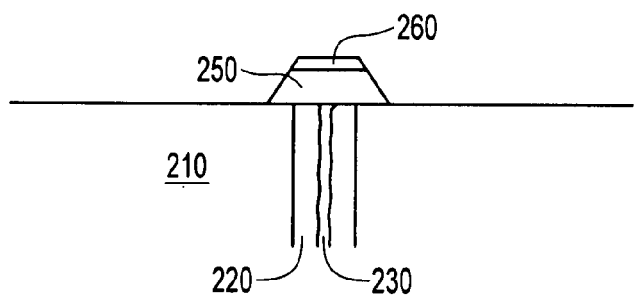
FIG. 6(a) is a cross-sectional view of a portion of the exemplary memory device of FIG. 2 during a stage of fabrication subsequent to that shown in FIG. 5.
Figure 6B:
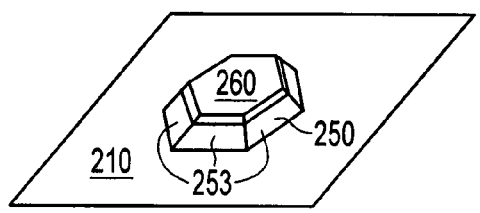
FIG. 6(b) is an isometric view of a portion of another exemplary memory device during a stage of fabrication subsequent to that shown in FIG. 5.
Figure 7:
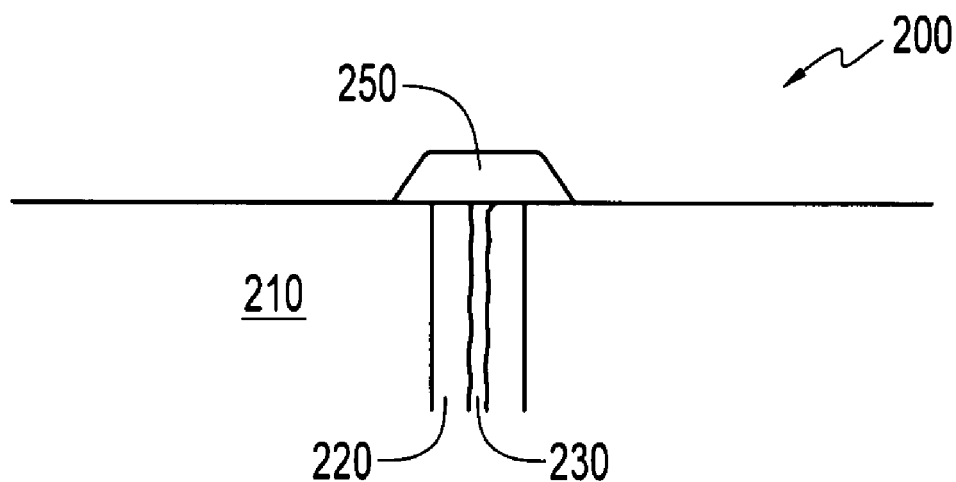
FIG. 7 is a cross-sectional view of a portion of the exemplary memory device of FIG. 2 during a stage of fabrication subsequent to that shown in FIG. 6.

Next, as shown in FIG. 5, the conductive material for forming the cap 250 is coated with a photoresist layer 260. As shown in FIG. 6(a), the conductive material for the cap is then etched using conventional patterning techniques to form individual caps 250 over respective plugs 220. These conventional techniques include known dry or wet etch methods compatible with the conductive material of the cap 250. Other exemplary embodiments include etching the cap 250 to include faceted sides 253, as shown in FIG. 6(b). The faceted sides 253 of cap 250 provide smooth contact points and have a lower fabrication cost compared to rounded caps. The photoresist 260 is then removed, as illustrated by FIG. 7, leaving conductive cap 250 exposed.

Figure 8:
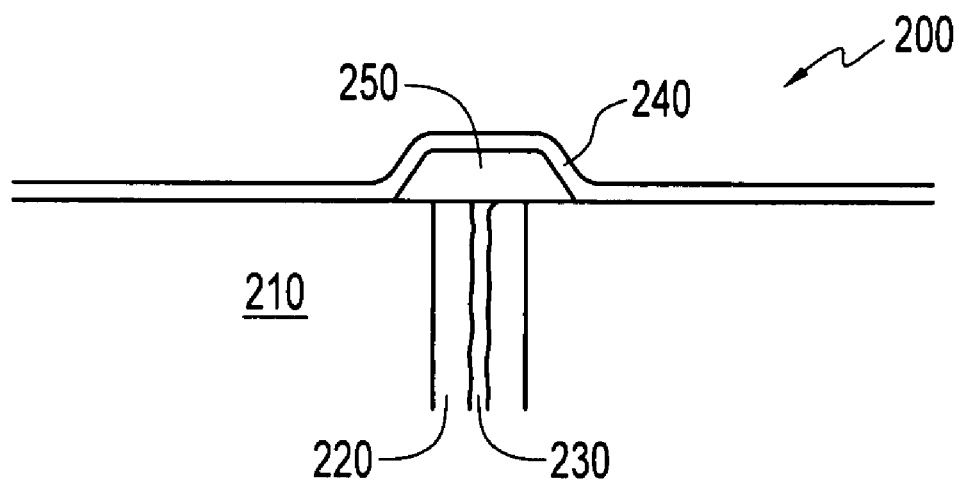
FIG. 8 is a cross-sectional view of a portion of the exemplary memory device during a stage of fabrication subsequent to that shown in FIG. 7.

With reference to FIG. 8, exemplary methods of completing the memory device 200 will now be described. Cell material 240 is deposited over the array. The cell material 240 may include resistance variable cell material, like the materials necessary for construction of PCRAM memory cells constructed according to the teachings of U.S. Pub. Appl. Nos. 2003/0155589 and 2003/0045054, each assigned to Micron Technology Inc., and incorporated herein by reference. Appropriate cell materials include layers of germanium selenide and silver-containing layers. The memory device 200 will also include a plurality of upper electrodes (not shown), each formed over the cell material 240 and over each bottom electrode 220, 250, defining the memory cell as the portion of the cell material 240 therebetween.

The embodiments described above refer to the formation of a memory device 200 structure in accordance with the invention. It must be understood, however, that the invention contemplates the formation of other integrated circuit elements, and the invention is not limited to use with memory devices. Moreover, although described as a single memory device 200, the device 200 can be fabricated as a part of a memory array and operated with memory element access circuits.

Figure 9:
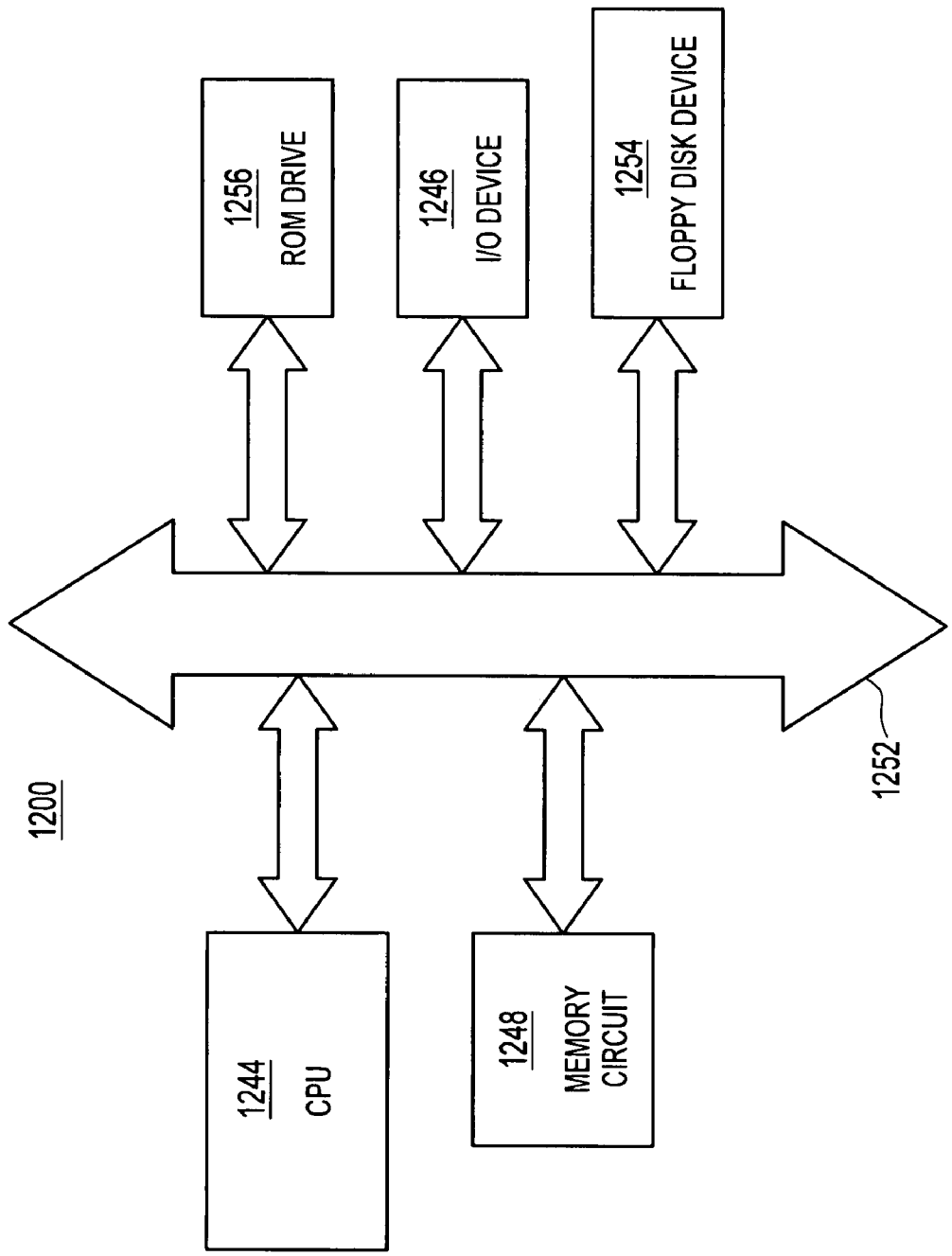
FIG. 9 illustrates a computer system having a memory element in accordance with the invention.

FIG. 9 is a block diagram of a processor-based system 1200, which includes a memory circuit 1248, for example a resistance variable memory device circuit employing non-volatile memory devices 200 (FIG. 2) fabricated in accordance with the invention. The processor system 1200, such as a computer system, generally comprises a central processing unit (CPU) 1244, such as a microprocessor, a digital signal processor, or other programmable digital logic devices, which communicates with an input/output (I/O) device 1246 over a bus 1252. The memory circuit 1248 communicates with the system over bus 1252 typically through a memory controller.

In the case of a computer system, the processor system may include peripheral devices such as a floppy disk drive 1254 and a compact disc (CD) ROM drive 1256, which also communicate with CPU 1244 over the bus 1252. Memory 1248 is preferably constructed as an integrated circuit, which includes one or more resistance variable memory devices 200. If desired, the memory 1248 may be combined with the processor, for example CPU 1244, in a single integrated circuit.

The above description and drawings are only to be considered illustrative of exemplary embodiments which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming a memory device, the method comprising:
    forming a circuit over a semiconductor substrate;
    forming at least one first insulating layer having a top surface over said circuit;
    forming a via in said at least one first insulating layer;
    filling said via with a first conductive material;
    planarizing said first conductive material;
    forming a conductive cap over said via and a portion of said first insulating layer immediately surrounding said via, said conductive cap comprising a second conductive material in contact with said first conductive material and being formed with a plurality of facets on sidewalls of said cap; and
    forming at least one memory cell over said cap.

2. The method of claim 1, wherein said first conductive material comprises tungsten.

3. The method of claim 2, wherein said first conductive material comprises Ti/TiN/W.

4. The method of claim 2, wherein said first conductive material comprises TiN/W.

5. The method of claim 1, wherein forming said cap comprises forming said second conductive material over said first conductive material and said first insulating layer and etching said second conductive material to form said cap.

6. The method of claim 1, wherein said first conductive material is the same as the second conductive material.

7. The method of claim 1, wherein each of said first and said second conductive materials comprise tungsten alloys.

8. The method of claim 1, wherein said second conductive material comprises Ti/TiN/W.

9. The method of claim 1, wherein said second conductive material comprises TiN/W.

10. The method of claim 1, wherein said second conductive material comprises nitride.

11. The method of claim 1, wherein the at least one memory cell is a resistance variable memory cell.

12. The method of claim 1, wherein the at least one memory cell is a includes a chalcogenide material.

13. The method of claim 12, wherein the memory cell is a programmable conductor random access memory cell.

* * * * *

UNITED STATES PATENT AND TRADEMARK OFFICE
CERTIFICATE OF CORRECTION

PATENT NO. : 7,348,238 B2  Page 1 of 1
APPLICATION NO. : 11/207764
DATED : March 25, 2008
INVENTOR(S) : Liu It is certified that error appears in the above-identified patent and that said Letters Patent is hereby corrected as shown below:

In column 6, line 25, in Claim 12, after "cell" delete "is a".

Signed and Sealed this

Tenth Day of June, 2008

JON W. DUDAS
*Director of the United States Patent and Trademark Office*